US008778786B1

(12) United States Patent
Scudder et al.

(10) Patent No.: US 8,778,786 B1
(45) Date of Patent: Jul. 15, 2014

(54) METHOD FOR SUBSTRATE PRESERVATION DURING TRANSISTOR FABRICATION

(75) Inventors: Lance Scudder, Sunnyvale, CA (US);
Pushkar Ranade, Los Gatos, CA (US);
Dalong Zhao, San Jose, CA (US);
Teymur Bakhishev, San Jose, CA (US);
Urupattur C. Sridharan, San Jose, CA (US); Taiji Ema, Mie-ken (JP);
Toshifumi Mori, Hachiouji (JP);
Mitsuaki Hori, Kuwana (JP); Junji Oh, Kuwana (JP); Kazushi Fujita, Kuwana (JP); Yasunobu Torii, Kuwana (JP)

(73) Assignee: SuVolta, Inc., Los Gatos, CA (US)

( * ) Notice: Subject to any disclaimer, the term of this patent is extended or adjusted under 35 U.S.C. 154(b) by 115 days.

(21) Appl. No.: 13/482,394

(22) Filed: May 29, 2012

(51) Int. Cl.
*H01L 21/425* (2006.01)
*H01L 21/336* (2006.01)
*H01L 21/266* (2006.01)
*H01L 21/311* (2006.01)

(52) U.S. Cl.
CPC ......... *H01L 21/266* (2013.01); *H01L 21/31133* (2013.01)
USPC ............................ 438/527; 438/530; 438/308

(58) Field of Classification Search
CPC .............. H01L 21/266; H01L 27/0928; H01L 21/31133
USPC ......................................... 438/308, 527, 530
See application file for complete search history.

(56) References Cited

U.S. PATENT DOCUMENTS

| 5,792,680 | A * | 8/1998 | Sung et al. ................ 438/210 |
| 2001/0019285 | A1 | 9/2001 | Lin et al. | |
| 2001/0046787 | A1 | 11/2001 | Kerber et al. | |
| 2002/0001890 | A1 | 1/2002 | Lee | |
| 2002/0142525 | A1 | 10/2002 | Ohnuma | |
| 2005/0181612 | A1 | 8/2005 | Brask et al. | |
| 2005/0212038 | A1 | 9/2005 | Fujiwara | |
| 2006/0011214 | A1 | 1/2006 | Liu et al. | |
| 2006/0157797 | A1 * | 7/2006 | Tateshita ................ 257/369 |
| 2006/0252191 | A1 * | 11/2006 | Kammler et al. ........... 438/197 |
| 2007/0164360 | A1 * | 7/2007 | Morooka et al. ........... 257/347 |
| 2007/0224773 | A1 | 9/2007 | Murakami et al. | |
| 2008/0072926 | A1 | 3/2008 | Munakata | |
| 2008/0305598 | A1 | 12/2008 | Horsky et al. | |
| 2009/0130816 | A1 | 5/2009 | Takahashi et al. | |
| 2009/0209059 | A1 | 8/2009 | Isaka et al. | |

(Continued)

OTHER PUBLICATIONS

Duffy et al., "Influence of Preamorphization and Recrystallization on Indium Doping Profiles in Silicon" Journal of Vacuum Science & Technology B: Microelectronics Processing and Phenomena American Vacuum Society, New York, NY, vol. 22, No. 3, pp. 865-868, May 2004.
Hori, et al., "Sub-NM Screening Layer Approach for Ultra Shallow Junction Formation", I Font-End Processing—Physics and Technology of Dopant-Defect Interactions Symposium, Mater. Res. Soc., Warrendale, PA, pp. 15-18, Jun. 2005.
"Native Oxide", Semiconductor Glossary, 2 pages, Jan. 10, 2012.
Hydrofluoric acid, 5 pages, Jan. 10, 2012.
"Material Safety Data Sheet" MSDA-TMAH, 4 pages, Jul. 16, 2004.
Epitaxy, 5 pages, 2011.
Doolittle, Alan, "Ion Implantation", 21 pages, web page.

*Primary Examiner* — Luan C Thai
(74) *Attorney, Agent, or Firm* — Baker Botts L.L.P.

(57) ABSTRACT

Silicon loss prevention in a substrate during transistor device element manufacture is achieved by limiting a number of photoresist mask and chemical oxide layer stripping opportunities during the fabrication process. This can be achieved through the use of a protective layer that remains on the substrate during formation and stripping of photoresist masks used in identifying the implant areas into the substrate. In addition, undesirable reworking steps due to photoresist mask misalignment are eliminated or otherwise have no effect on consuming silicon from the substrate during fabrication of device elements. In this manner, device elements with the same operating characteristics and performance can be consistently made from lot to lot.

19 Claims, 6 Drawing Sheets

(56) References Cited

U.S. PATENT DOCUMENTS

| | | |
|---|---|---|
| 2010/0107927 A1 | 5/2010 | Stewart et al. |
| 2010/0151677 A1 | 6/2010 | Braeckelmann et al. |
| 2010/0203704 A1 | 8/2010 | Inumiya et al. |
| 2010/0252873 A1 | 10/2010 | Cheng |
| 2011/0006349 A1 | 1/2011 | Ota et al. |
| 2011/0037125 A1* | 2/2011 | Cheng et al. .................. 257/351 |
| 2011/0201164 A1 | 8/2011 | Chung et al. |
| 2011/0248348 A1 | 10/2011 | Gan et al. |

* cited by examiner

US 8,778,786 B1

METHOD FOR SUBSTRATE PRESERVATION DURING TRANSISTOR FABRICATION

TECHNICAL FIELD OF THE DISCLOSURE

The present disclosure relates in general to semiconductor manufacturing processes and more particularly to a method for substrate preservation during transistor fabrication.

BACKGROUND

Cost effective electronic manufacturing requires transistor structures and manufacturing processes that are reliable at nanometer scales and that do not require expensive or unavailable tools or process control conditions. While it is difficult to balance the many variables that control transistor electrical performance, finding suitable transistor dopant structures and manufacturing techniques that result in acceptable electrical characteristics such as charge carrier mobility and threshold voltage levels are a key aspect of such commercially useful transistors.

SUMMARY

From the foregoing, it may be appreciated by those of skill in the art that a need has arisen for a technique to fabricate improved transistor devices on a substrate that reduce, eliminate, or accommodate for instances of substrate etching in order to provide improved and consistent operational performance. In accordance with the following disclosure, there is provided a method for substrate preservation during transistor fabrication that substantially eliminates or greatly reduces disadvantages and problems associated with conventional transistor device fabrication and design.

A method for substrate preservation during transistor manufacture is provided that includes forming a first lot of various device type elements in a first substrate using a first process. A second lot of various device type elements is subsequently formed in a second substrate using the first process. A loss of silicon during the first process occurring in the second substrate of the second lot with respect to the various device types therein is substantially a same amount as a loss of silicon in the first substrate of the first lot with respect to the various device type elements therein. The various device type elements can be formed in the second lot with the same operating characteristics and performance as the various device type elements formed in the first lot. A protection layer is used in the first process that remains in place and protects the substrate during formation of each lot from silicon loss during photoresist formation and stripping.

The present disclosure describes various technical advantages and features not present in conventional transistor fabrication and design. Embodiments of the present disclosure may enjoy some, all, or none of these advantages. Other technical advantages may be readily apparent to one skilled in the art from the following figures, description, and claims.

BRIEF DESCRIPTION OF THE DRAWINGS

For a more complete understanding of the present disclosure, reference is made to the following description taken in conjunction with the accompanying drawings, wherein like reference numerals represent like parts, in which.

DETAILED DESCRIPTION

FIGS. 1A to 1F illustrate a fabrication process useful to achieve multiple transistor devices on a substrate, wherein the fabrication process contemplates a plurality of doping steps followed by a formation of a substantially undoped epitaxial layer. Though discussed in terms of fabricating an NMOS low voltage threshold (LVT) device element, an NMOS standard voltage threshold (SVT) device element, an NMOS static random access memory (SRAM) device element, a PMOS low voltage threshold (LVT) device element, a PMOS standard voltage threshold (SVT) device element, and a PMOS static random access memory (SRAM) device element, other device elements may be fabricated as well. Typically, the threshold voltage device elements are formed by way of a screen implant, which is implemented using implant conditions to result in a peak concentration of approximately $5 \times 10^{18}$ to $1 \times 10^{20}$ atoms/cm$^3$. The device elements support circuit designs which may be digital or analog requiring various supply voltage levels, and the fabrication process is purposed to integrate the circuit designs into structures fabricated on a substrate to result in individually diced, semiconductor chips. It shall be noted that multiple sizes of each device type with different gate lengths and widths may be fabricated using the processes disclosed herein.

Figure 1A:
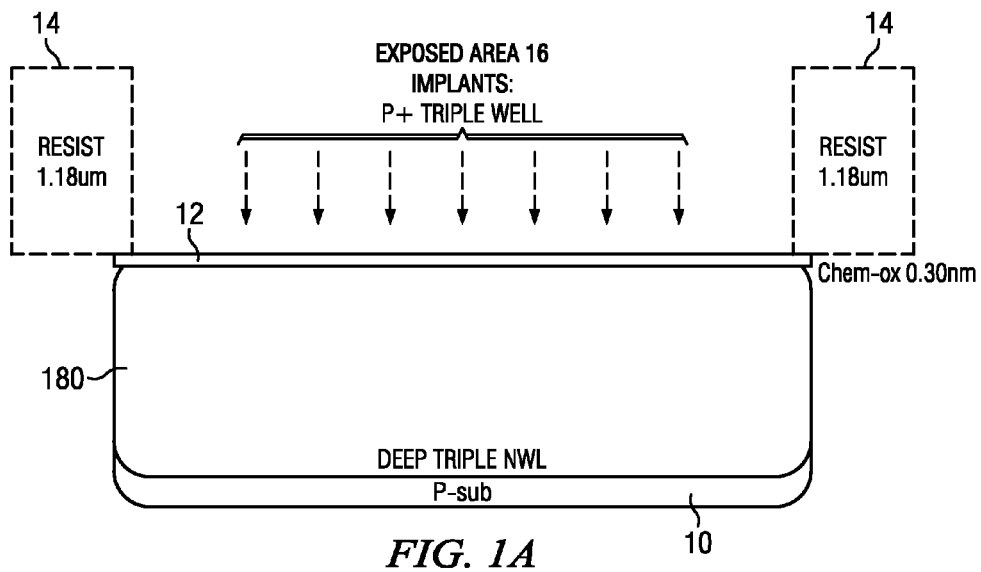
FIGS. 1A to 1F illustrate a fabrication process for multiple transistor devices on a substrate which limits a number of steps resulting in substrate etching.

In FIG. 1A, a thin chemical oxide layer 12 on the order of less than 1 nanometer is formed on a substrate 10. Though shown as a p-substrate, substrate 10 may be an n-substrate. For discussion purposes, the process will be described where substrate 10 is a p-type crystalline silicon substrate. Chemical oxide layer 12 formed on substrate 10 as shown herein has a thickness of approximately 0.3 nanometers and serves to protect the substrate surface for a subsequent ion implantation. Chemical oxide layer 12 may be based upon any process involving a chemical reaction with a surface of silicon where the resultant film is a thin native oxide layer. Typically used processes include wet etching based upon potassium hydroxide, hydrogen peroxide, ammonia or ammonia compounds such as ammonium hydroxide or combinations thereof or other chemical processes effective to remove a small amount of silicon and form a thin oxide layer on the silicon surface. An example treatment is $NH_4OH/H_2O_2/H_2O \rightarrow HF/H_2O \rightarrow HCL/H_2O_2/H_2O$. Then, a photoresist layer 14 is formed on chemical oxide layer 12 and patterned to expose those portions of substrate 10 where device elements are to be formed. In this instance, photoresist layer 14 provides a mask for an exposed area 16 into which a well structure is to be formed. The well structure may be a single well, or if the circuit application calls for, a dual well, triple well or other well structure. Though shown as a single exposed area, exposed area 16 is meant to encompass multiple exposed areas with respect to substrate 10. In exposed area 16, an n-type dopant, preferably phosphorous, is implanted in substrate 10 in a manner to form a deep N-well 180 for the NMOS device elements in triple P-well. The triple well process is useful when the devices will utilize a body biased voltage control scheme.

Figure 1B:
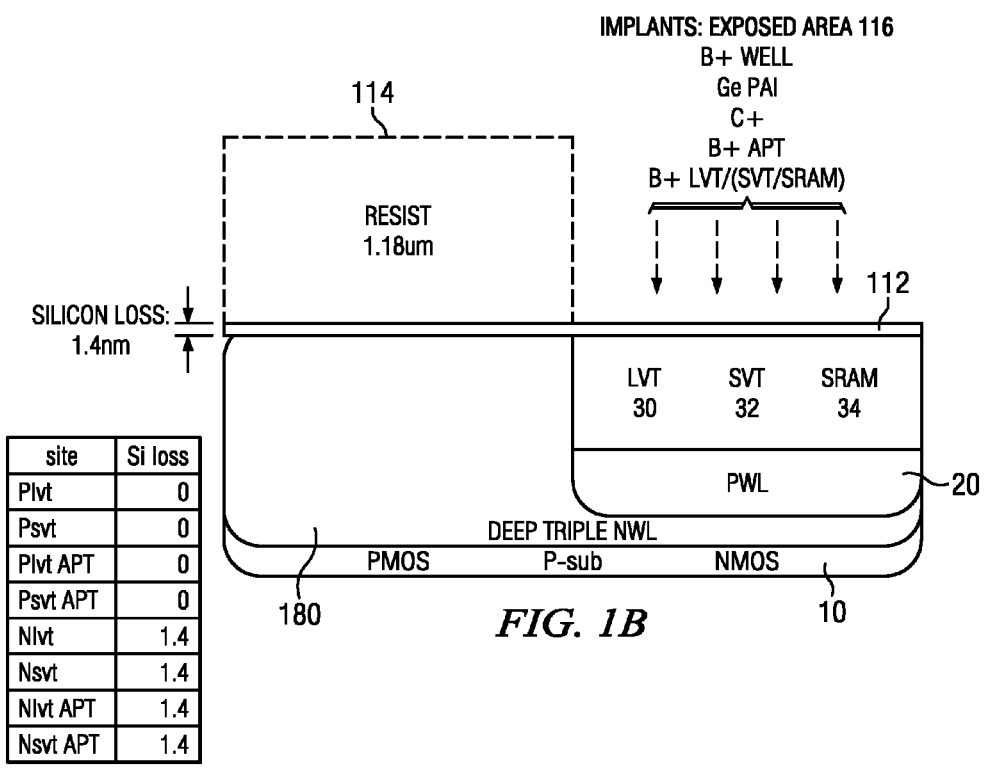

In FIG. 1B, after the triple-well implant 180, photoresist layer 14 and chemical oxide layer 12 are stripped away. The photoresist layer 14 may be stripped using a wet or dry etch process sufficient to remove the material. Then, the chemical oxide layer 12 is removed, typically using a wet etch such as a hydrofluoric (HF) acid clean. It is noted that the HF cleaning process will inevitably consume a portion of the surface of substrate 10 underlying the chemical oxide layer 12 as discussed further below. An example treatment includes $NH_4OH/H_2O_2/H_2O \rightarrow HF/H_2O \rightarrow HCL/H_2O_2/H_2O$ where the $NH_4OH/H_2O_2/H_2O$ consumes the silicon of substrate 10. A new chemical oxide layer 112 is then formed on the HF-cleaned substrate 10 and a new photoresist layer 114 is applied thereon and patterned to provide a P-well mask for an exposed area 116. Photoresist layer 114 is intended to form the foundation for individual device elements shown herein as NMOS LVT 30, SVT 32, and SRAM 34, though other devices may also be formed. In this example, all of the device elements are formed starting with a common LVT implant, and then in a later process step (shown in FIG. 1C) the SVT and SRAM device elements will be formed by way of additional implants to distinguish those elements from the LVT elements. Similar to exposed area 16, exposed area 116 is shown as a single exposed area but is meant to encompass multiple exposed areas with respect to substrate 10. In the exposed areas identified by exposed area 116, a p-type dopant implant, preferably boron, is performed to form P-well 20. Preferably, a germanium implant effective to cause a local amorphization of the silicon substrate in the top portion of the p-well 20 (known as pre-amorphization implant) is performed. To inhibit migration of dopants upward toward the to-be-formed gate structure, carbon is introduced into the silicon, usually by way of ion implantation. Next, an anti-punchthrough implant (typically using boron) is performed followed by another implant, again typically boron, by selecting a dose and energy level to result in a pre-selected concentration and thickness to form a screen layer. Put another way, the screen layer, by being more heavily concentrated than the anti-punchthrough region, on the order of 1.5 to 2 times the concentration of dopants or more, effectively screens the anti-punchthrough region and the well from the electrical activity in the transistor channel thereabove.

After these implants are performed in exposed area 116, photoresist layer 114 and chemical oxide layer 112 are stripped away in a similar manner as discussed with photoresist layer 14 and chemical oxide layer 12. Next, preferably, a low temperature anneal or other heating step is performed to recrystallize the amorphized silicon in substrate 10. A high temperature anneal may then be performed as necessary to activate the dopants implanted in exposed area 116. Preferably, the anneal is carried out in a manner so as to minimize further diffusion of dopants.

The stripping away of photoresist layer 14/114 and chemical oxide layer 12/112 causes a portion of substrate 10 and N-well 18 and P-well 20 to be etched away thereby modifying the depths and therefore the thicknesses of at least the screen implants. In the example provided herein, an amount of silicon lost due to this etching phenomenon is approximately 1.4 nanometers per masking cycle. In one embodiment, the process of stripping an old photoresist layer 14 and a pre-existing chemical oxide layer 12 and forming a new chemical oxide layer 12 and a new photoresist layer 14 is repeated for each mask change in exposed areas to achieve the desired implant therein. Thus, a loss of silicon in substrate 10 results in a change to the final depth and thicknesses of at least some of the screen implants therein. Changes to the depth and thickness of a screen implant results in undesirable changes to device characteristics including performance.

In addition, silicon loss also occurs as a result of misalignment in photoresist mask positioning that results in a photoresist mask rework where the misaligned photoresist mask and chemical oxide layer are removed by etching and a new chemical oxide layer and newly aligned photoresist mask are formed. These unscheduled reworks introduce additional silicon loss that can affect lot to lot performance. The amount of silicon lost during manufacture may not be the same from one lot to the next due to reworks that may occur in one lot but not the next lot, leading to even further device variations between lots. The present disclosure solves the problem of silicon loss to lead to more reliable manufacturing and device integrity. It accomplishes this by limiting or otherwise eliminating the number of separate implantations through chemical oxide with successive stripping of photoresist layer 14 and chemical oxide layer 12 during direct fabrication. Moreover, the present disclosure provides a technique where any process step that may result in unscheduled rework has no effect on the substrate silicon loss or the depths of the device elements therein.

Figure 1C:
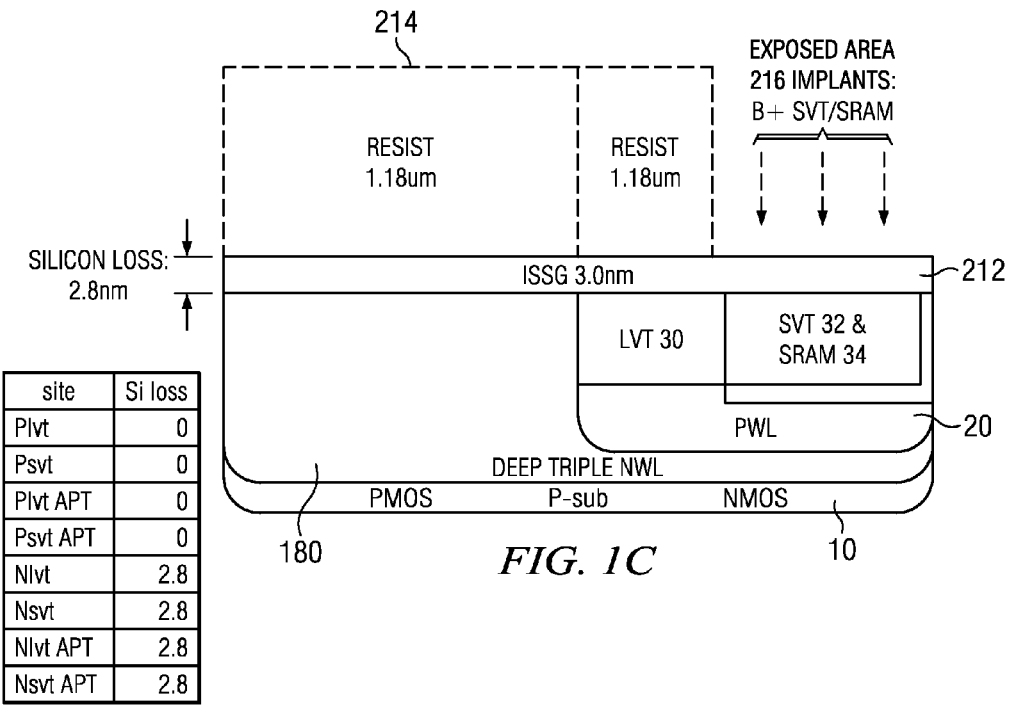

In FIG. 1C, an ISSG oxide layer 212 is formed on substrate 10. ISSG oxide layer 212 may be grown, deposited, or formed by in situ steam generation or any other process that provides for a thicker and denser oxide layer than chemical oxide layer 12/112. The thickness of ISSG oxide layer 212 may be approximately 3.0 nanometers thick as an example, though other thicknesses sufficient to protect the silicon substrate underlying the ISSG may be utilized. The function of the ISSG oxide layer 212 is to provide a layer of protective oxide through which ion implantation can be performed to effectively dope the substrate directly below the protective oxide. The benefit of using ISSG oxide layer 212 is that it is robust and therefore can tolerate multiple implants before it is removed compared to its chemical oxide counterpart. In the example provided herein, ISSG oxide layer 212 is to remain on substrate 10 during subsequent implanting and photoresist stripping steps. ISSG oxide layer 212 tolerates most resist removal techniques including ashing or wet etch that allow the resist film to be removed cleanly and selectively to the layer immediately therebelow. Additionally, the ISSG oxide layer 212 can remain in place through multiple sequences of steps including any unscheduled reworking steps, without having to be removed. Because mask reworking can occur without removing the ISSG in the first place, the mask reworking can be performed while not causing a loss of some of the underlying silicon.

Formation of ISSG oxide layer 212 preferably occurs very early in the process, prior to the formation of the wells, though alternatively, a chemical oxide film may be used for purposes of the well implants, and subsequently the ISSG oxide layer 212 may be formed prior to the various Vt implants. It is noted that ISSG oxide layer 212 formation may be the first thermal step applied to substrate 10; however, in this example it is the third thermal step (following the 650 C SPE and 1000 C/0 s HT spike anneal). An example ISSG process may include subjecting substrate 10 to a temperature of 810° C. for a time of 10 seconds. Therefore, the preferred sequence for using ISSG oxide layer 212 is prior to the formation of implanted regions where the resultant depth of the doped region is specified. Alternatively, ISSG oxide layer 212 may be used in a context where materials selected or treatment is to be performed to the substrate so as to inhibit the migration of the dopants for which migration should be inhibited. ISSG oxide layer 212 is usually not used, however, for the Ge pre-amorphization step. Therefore, the process sequence is typically organized around setting forth the Ge pre-amorphization step to occur either before ISSG formation, or after ISSG can be stripped away, and supplanted with a native chemical oxide which is more amenable to proper formation of the amorphized silicon structure using Ge.

After ISSG oxide layer 212 is formed, photoresist layer 214 is patterned on substrate 10 to provide a mask to expose only the NMOS SVT 32 and SRAM 34 device elements in a smaller exposed area 216. An additional boron screen implant is performed to further define the SVT 32 and SRAM 34 device elements. Anti-punchthrough implants are also performed as needed (not shown). Photoresist layer 214 is then stripped away using a process that is selective to ISSG oxide layer 212 so as to leave the ISSG oxide layer 212 substantially as is.

Figure 1D:
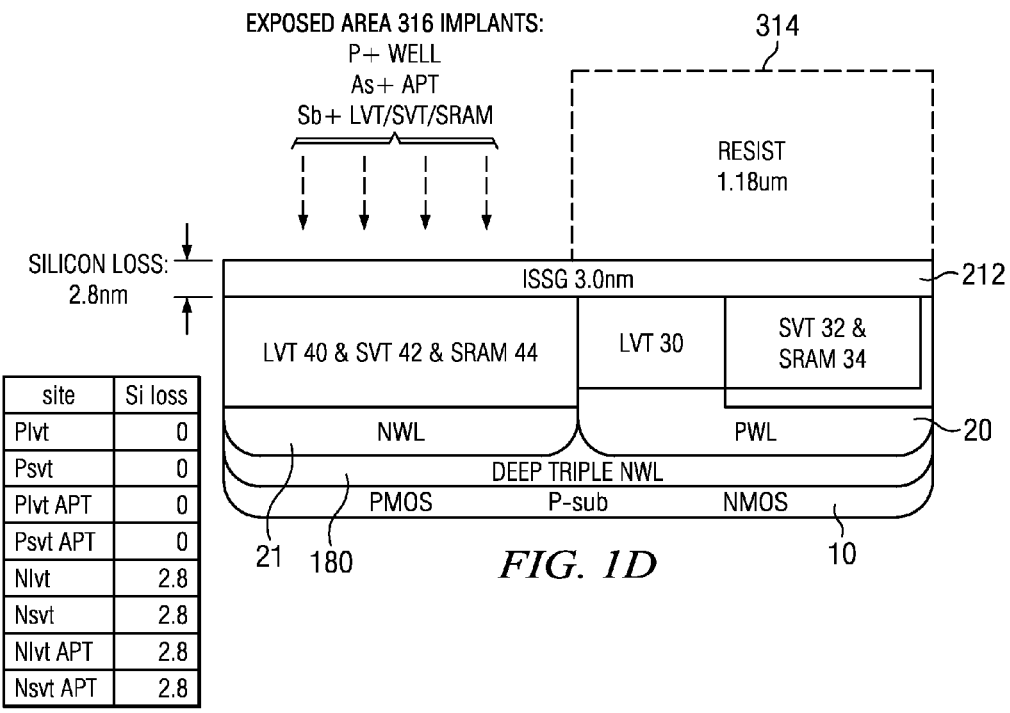

In FIG. 1D, a photoresist layer 314 is formed on substrate 10 to provide a N-well mask for implanting in exposed area 316 an n-type dopant, preferably P, for an optional N-well 21. As or Sb material, with Sb being preferred, is used for implanting an anti-punchthrough layer, and then followed by a Sb screen implant to form PMOS LVT 40, SVT 42, and SRAM 44 device elements. After these implant steps are performed, photoresist layer 314 is stripped away from ISSG oxide layer 212 using an etch step that stops on the ISSG oxide layer 212. No notable loss of silicon of substrate 10 occurs when photoresist layer 314 is stripped away due to the protection provided by ISSG oxide layer 212.

Figure 1E:
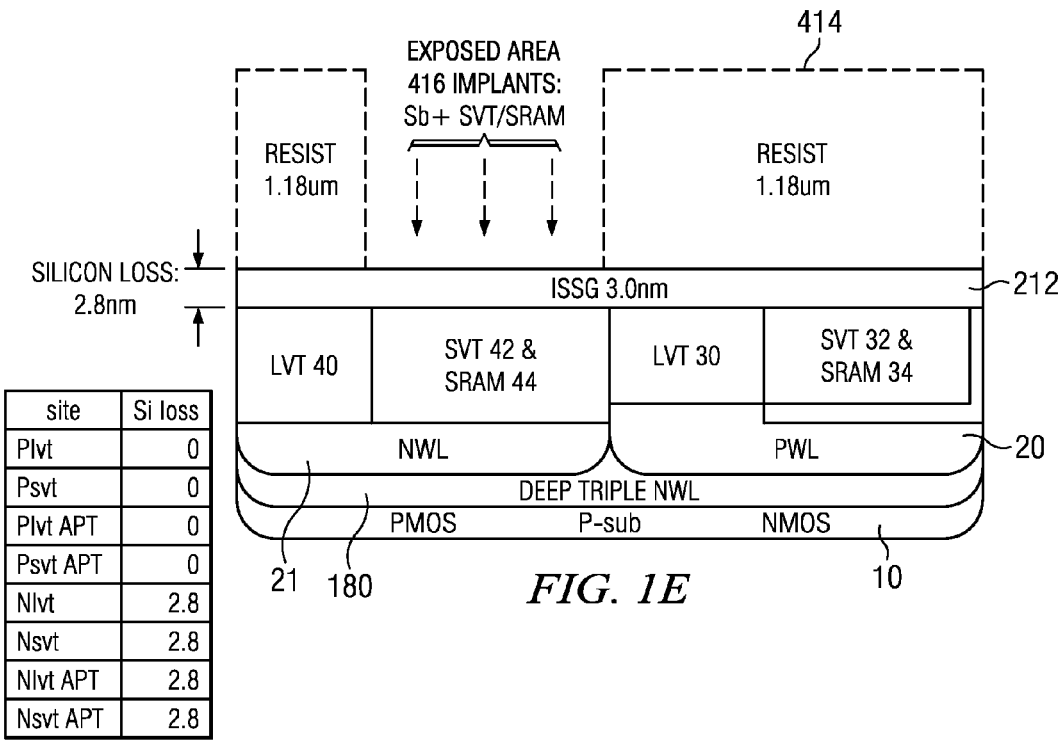

In FIG. 1E, another photoresist layer 414 is formed on ISSG oxide layer 212 to provide a VT mask exposing only the PMOS SVT 42 and SRAM 44 device elements in a smaller exposed area 416. An adder Sb or As screen implant is performed to further define the PMOS SVT 42 and SRAM 44 device elements. Photoresist layer 414 is then stripped away using a process that stops on the ISSG oxide layer 212.

Figure 1F:
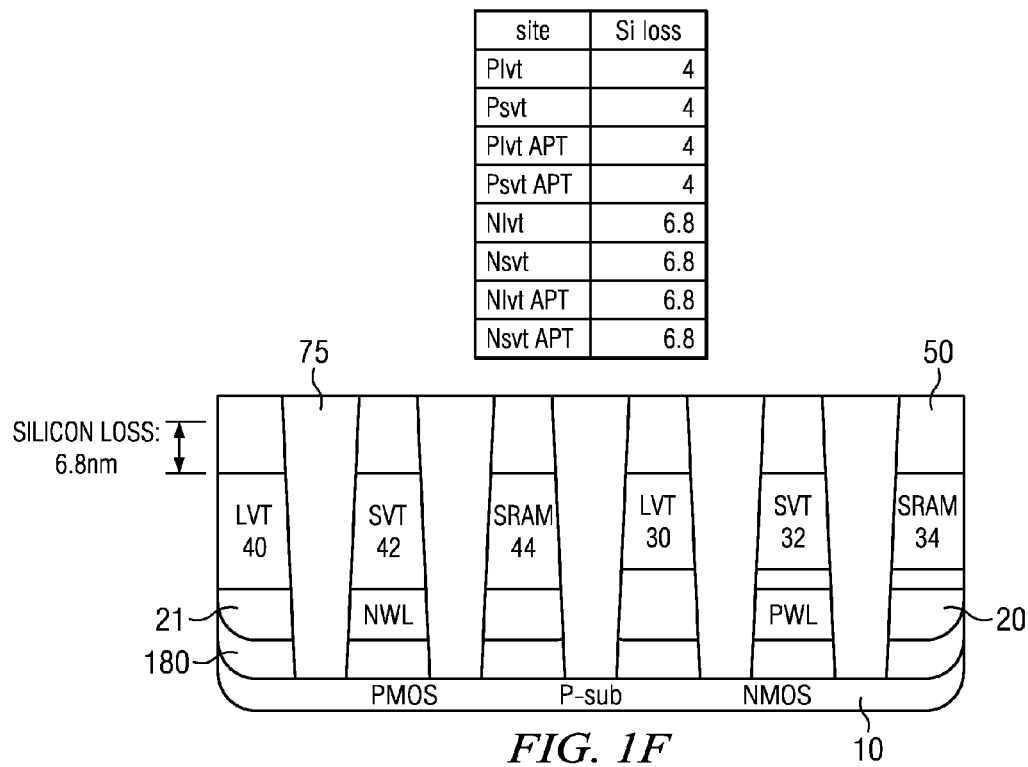

In FIG. 1F, ISSG oxide layer 212 is then also stripped away using a process that is highly selective to the silicon therebelow, preferably a hydrogen fluoride solution formulated to etch the desired film cleanly. Alternatively, the ISSG oxide layer 212 strip is carried out using a process that effectively removes a limited portion of the underlying silicon, for instance, between to 3 nanometers, to remove the surface portion that includes damage by the implant steps.

Preferably, prior to removing ISSG oxide layer 212, an optional high temperature anneal may be performed to activate the implanted dopants so as to retard dopant diffusion. In theory, if not first activated, the boron implant which is performed after formation of ISSG oxide layer 212 may diffuse in subsequent thermal steps. The optional high temperature anneal may be performed to place the boron in a substitutional state in the silicon crystalline lattice. ISSG oxide layer 212 may then be removed by a final clean. The final clean of ISSG oxide layer 212 may include a hydrofluoric HF acid cleaning and de-ionized water rinse step followed by an optional ammonium hydroxide-hydrogen peroxide bath to remove a fixed amount of surface of substrate 10, so as to prepare substrate 10 for the next process sequence.

An undoped epitaxial layer 50 is formed on substrate 10, preferably preceded by a further surface clean to remove any remaining oxide on the surface of substrate 10 and prepare substrate 10 for a deposition of epitaxial layer 50. Epitaxial layer 50 is preferably undoped, though intrinsically may be slightly doped at a level of approximately $1\times10^{17}$ to $1\times10^{18}$ atoms/cm$^3$. Epitaxial layer provides a substantially undoped channel for the device elements. Epitaxial layer 50 may be formed by a blanket growth on substrate 10, though alternatively, a selective epitaxial growth process may be used. Subsequently, conventional CMOS features are formed including shallow trench isolation regions 75 between device elements, gate oxide and gate formation, the adding of sidewall spacers, link region implants, source/drain implants, activating anneals, and I/O device implants. Gate, source, and drain contacts may then be formed for each device element according to fabrication processes known in the art, which are considered conventional with the proviso that usually the processes must be performed within the confines of a pre-set thermal budget and other constraints ordinarily understood by those skilled in the art to effectively avoid further diffusion of already-emplaced dopants below the channel.

Figure 2A:
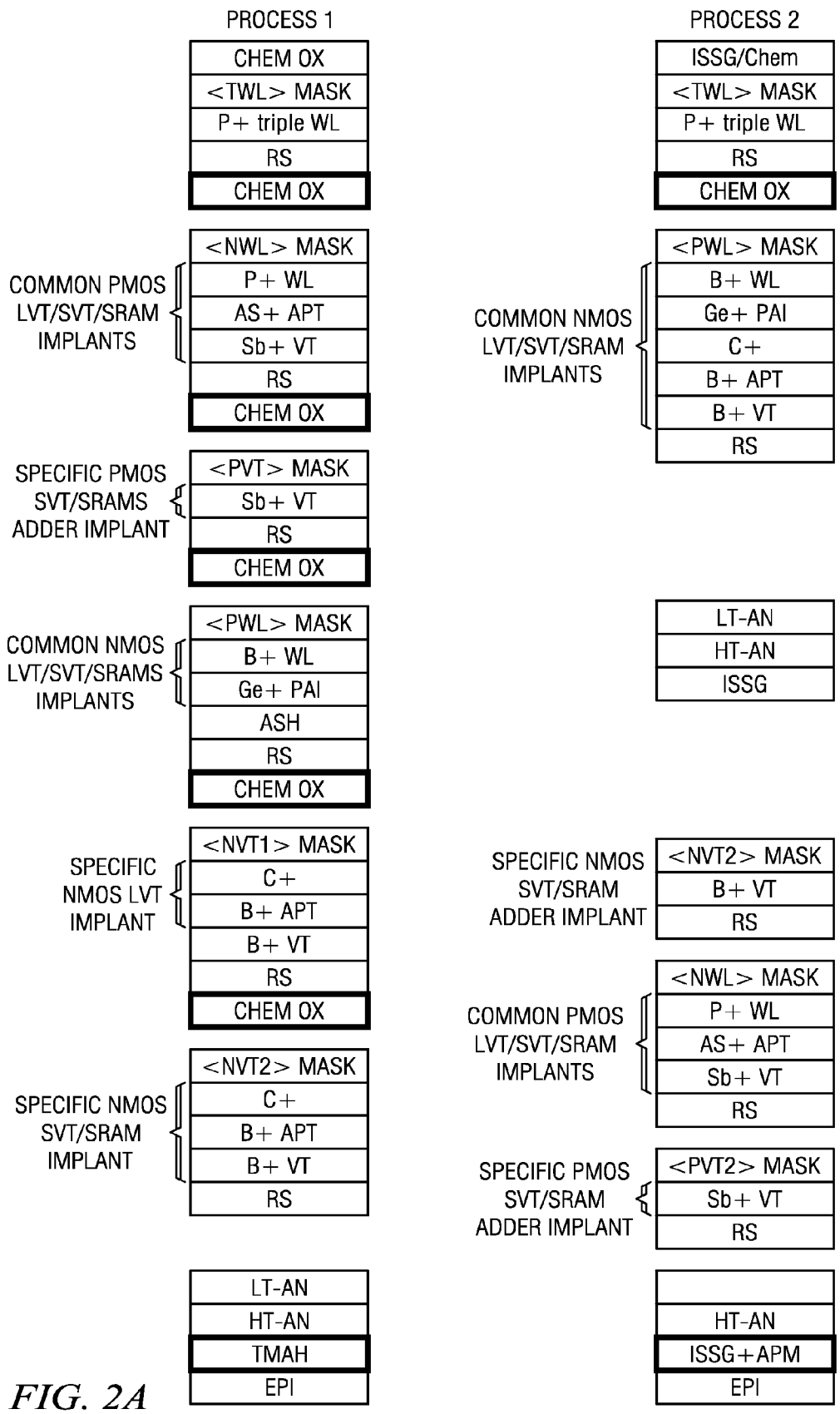
FIGS. 2A to 2C illustrate a chart comparing different alternative processes that limit an amount of substrate etching during transistor manufacturing.
Figure 2B:
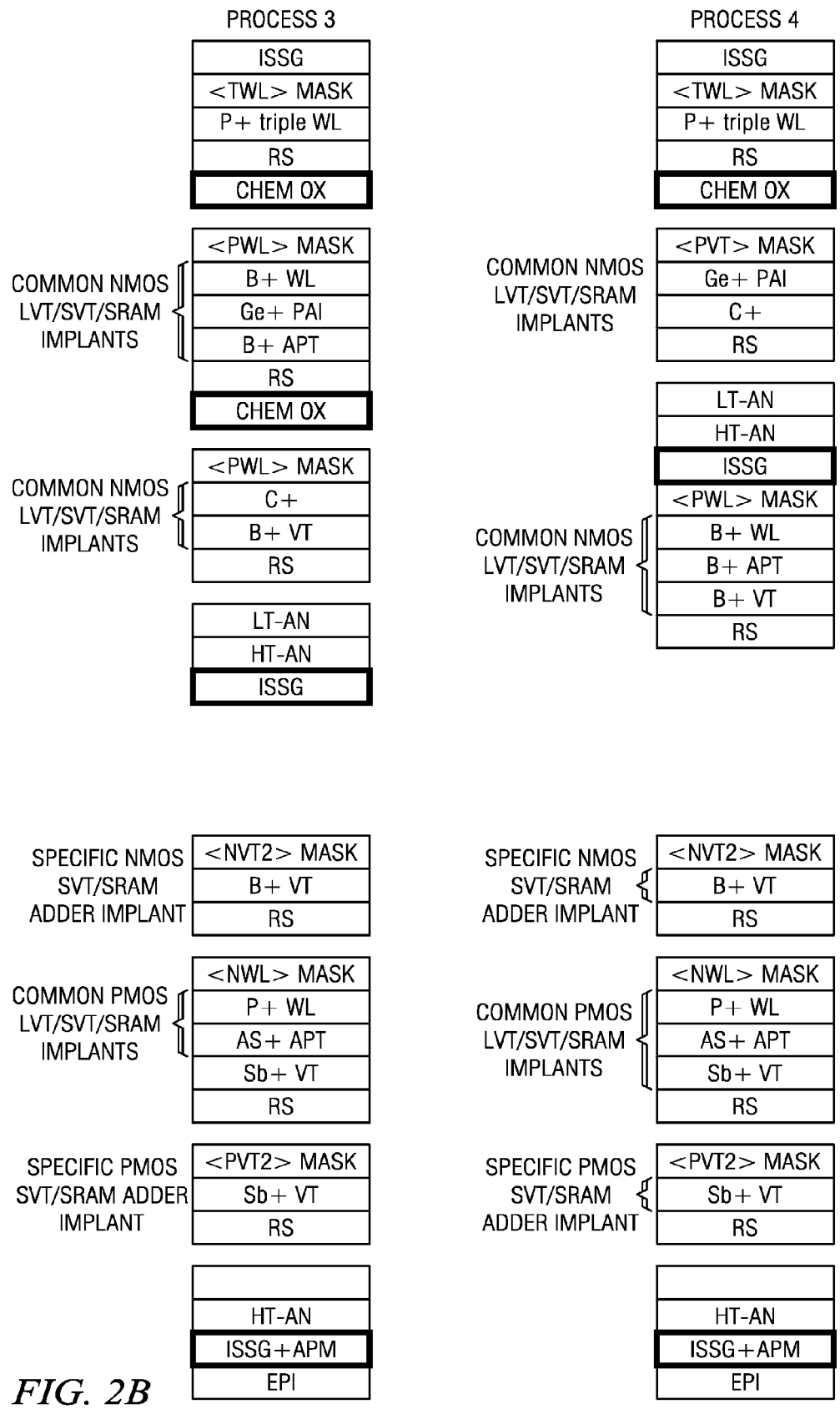
Figure 2C:
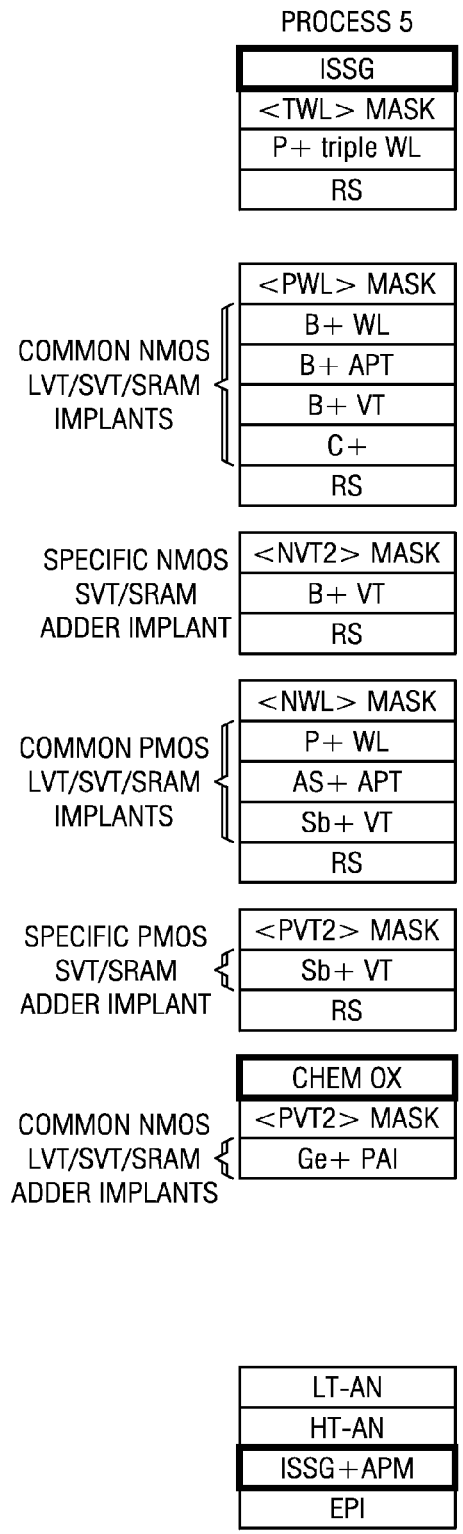

FIGS. 2A to 2C illustrate a chart comparing different exemplary and alternative processes with varying amounts of substrate etching. The purpose of describing the process flows in the following general manner is to set forth the expected differences in resultant silicon loss based upon comparable process sequences. Therefore, details of how each step is performed are not provided. Process 1 in FIG. 2A commences with a formation of a chemical oxide on a silicon surface. Thereupon, a deep well is performed, which in the flows provided herein, is a P-based triple well. The photoresist is stripped and then a new chemical oxide is formed. Then, a P-based well is formed, followed by an As anti-punchthrough implant, then an Sb screen implant. The photoresist is then stripped, and a new chemical oxide is formed. Then, the next device is formed. A B-based well is implanted, followed by a Ge pre-amorphization implant. The photoresist is again stripped and a new chemical oxide is formed. Then, C anti-diffusion dopant is implanted, and then the B-anti-punchthrough region is formed, as well as the B screen implant. The photoresist is stripped again and a new chemical oxide is formed. Then, for a higher Vt device, there is another C implant, followed by a B-anti-punchthrough region for such devices, and then a B-screen implant tailored for the higher Vt devices. As a general matter, higher Vt devices are achieved with a stronger dose implant to result in a relatively higher concentration of dopant per volume of silicon. Then, the photoresist is stripped, and a combination of low-temperature anneal and high-temperature anneal are performed to recrystallize and activate the dopants. Thereupon, a slight silicon etch is used to clean the surface of the doped silicon and a blanket epitaxial film of a pre-selected thickness, generally around 10 to 25 nm in thickness, is then grown. Process 1 in implementation results in an approximately 12.4 nanometer minimum silicon loss to substrate 10 without any mask reworking steps. The 12.4 nanometer silicon loss comes from six photoresist and chemical oxide strips at an approximately 1.4 nanometer loss, a damaged surface etch at an approximately 3.0 nanometer loss, and an epitaxial layer preparation clean at an approximately 1.0 nanometer loss. However, Process 1 is also subject to possible multiple photoresist reworking steps at different stages of the fabrication process that can lead to greater silicon loss numbers as well as undesirable lot to lot variations. The end result of such significant silicon loss is significant changes in thickness of the screen implants, which in turn can affect the proper setting of threshold voltage for the affected device.

Alternative Process 2 in FIG. 2A starts with either an ISSG or chemical oxide film on a silicon substrate. A P-based deep triple well structure is formed, and then the resist is stripped and a chemical oxide is grown. Subsequently, a B-based well is formed, followed by a Ge pre-amorphization implant. Next, a C implant is performed to inhibit the migration of dopants into a to-be deposited epitaxial layer. Then, a B-anti-punchthrough region is formed, followed by a B screen layer for the lower Vt devices. The photoresist is stripped. Then an anneal cycle is performed to recrystallize the silicon and to activate the boron. Preferably, the anneal cycle includes a low-temperature anneal of approximately 550 to 750 degrees C., followed by a high-temperature anneal. Then, ISSG is formed. Then, the higher Vt devices are doped by a B implantation step. Then, the photoresist is stripped, leaving the ISSG in place. Next, a P-based well is formed, followed by an As anti-punchthrough region, and then a Sb implant to form a screening layer for the lower Vt devices. Then the photoresist is stripped again leaving the ISSG oxide in place. Next, there is another Sb implant so as to form the higher Vt devices. The photoresist is stripped. Thereupon, a high-temperature anneal is performed to activate the not-yet-activated dopants, at a temperature and time that is selected to achieve the desired dopant activation while minimizing the diffusion of the previously implanted dopants. Then, the ISSG is stripped to prepare the doped silicon surface for the epitaxial layer. The aforementioned process, in implementation, results in an approximate 6.8 nanometer overall silicon loss to substrate 10, with an approximate silicon loss of 5.4 nanometers for the NMOS device elements and an approximately 4.0 nanometer silicon loss to the PMOS device elements. The approximately 4.0 nanometer loss portion is fixed for all device elements in that all devices will see an approximately equal silicon removal due to the step of the slight silicon etch to remove the damaged portion of the surface of substrate 10 and prepare substrate 10 to receive undoped epitaxial channel layer 50. As a result, in Process 2, the silicon loss for the PMOS device elements is substantially all attributable to the fixed amount of silicon loss with no notable silicon loss occurring to the PMOS device elements during their specific formation. Any photoresist mask reworking steps performed in Process 2 occur prior to the removal of the ISSG. Implant depths in Process 2 are thus fixed from lot to lot, resulting in Process 2 not being nearly as sensitive to reworking events and providing consistency from one lot to the next.

Processes 3-5 show still further alternative process flows that effectively reduce silicon loss in substrate 10. Salient features are as follows. In process 3 shown in FIG. 2B, an additional chemical oxide layer step is used in order to separate the Ge+ germanium and C+ carbon implants because, in implementation, in some instances, better defect performance has been realized when these implants have been performed separately. More specifically, the Ge implant is of such a high energy and high dose that it may degrade the photoresist mask. Subsequently adding the C implant using the same photoresist mask can make subsequent removal of the now-damaged photoresist mask more difficult. The ability to clean the photoresist mask after the Ge+ germanium implant is more effective if done prior to the C implant. Process 3 does result in an additional chemical oxide removal step that results in a notable loss of silicon and is subject to reworking steps. However, the Ge pre-amorphization implant step and the B anti-punchthrough implant step are not sensitive to variations in thickness. Thus, negligible variations between lots occur in Process 3.

In process 4 shown in FIG. 2B, as compared to process 2 of FIG. 2A, a variation in the process flow is provided where only the Ge and C implants are performed following the formation of chemical oxide layer 12 while the B well, the B anti-punchthrough, and the B screen implants for the NMOS LVT 30, SVT 32, and SRAM 34 device elements are performed after formation of ISSG oxide layer 212 rather than before its formation as performed in process 2 and process 3.

Process 5 shown in FIG. 2C starts with the formation of ISSG oxide layer 212 with all of the implants being performed therethrough except for the Ge pre-amorphization implant which is subsequently performed through a chemical oxide layer. The Ge pre-amorphization implant destroys the silicon lattice by turning the silicon amorphous. A low temperature anneal is performed to recrystallize the amorphized substrate and return it to a single crystal silicon state. The step of Ge pre-amorphization implantation through chemical oxide layer 12 after other implant steps are performed is subject to rework. However, only a single point for potential rework is provided in Process 5 and benefits may be achieved by performing device implants prior to recrystallizing the substrate. The previous processes perform Ge pre-amorphization implantation, and low temperature anneal to recrystallize amorphized silicon due to this implant, earlier in the fabrication flow instead of at the end of the process flow as shown in Process 5.

An additional feature provided by these processes is either having the B boron implants in place prior to the Ge pre-amorphization implant step or performing the B implants after the Ge pre-amorphization implant, each being performed prior to recrystallizing substrate 10 by the low temperature anneal. Recrystallizing substrate 10 using the low temperature anneal (preferably below 750 degrees C.) following the B implants and the Ge pre-amorphization implants is performed to place the boron into a fully substitutional state in the lattice of substrate 10, thereby reducing its diffusion during subsequent thermal steps. All the processes described above perform a Ge pre-amorphization implant through chemical oxide layer 12. For Ge pre-amorphization implantation, a high energy and a heavy dose of germanium is used. With germanium being a relatively heavy element, oxygen may be knocked from the oxide on the surface into the lattice of substrate 10. This knock-on oxygen is undesirable, as it introduces unwanted contaminants into the silicon substrate. Thus, it is desirable to avoid implanting germanium through the thicker ISSG oxide layer 212 which tends to cause higher levels of unwanted knock-on oxygen. Implanting through a chemical oxide reduces the unwanted introduction of oxygen into the silicon.

The initial oxide layer 12 may be a chemical oxide layer as described above or may be an ISSG oxide layer. Processes 1-5 show various embodiments where the initial oxide layer is a chemical oxide layer or an ISSG oxide layer. Any loss of silicon due to the removal of the initial oxide layer occurs prior to the implantation steps of individual device elements that are sensitive to the resulting depth of the implanted regions. In Processes 1-4, though a loss of silicon occurs as a result of removal of the initial oxide layer, the only implant affected is the P-based triple well implant. However, this implant is a relatively deep implant and any device variations are negligible even if the depth of this implant changes by a nanometer or two.

Though described using ISSG oxide for layer 212, layer 212 in general is a protective film that is sufficiently robust that it removes the need of a HF strip and reoxidation for every masking step and implant. A different type of oxide, such as furnace oxide or deposited oxide may be used instead or another material, for instance nitride, may be used for layer 212. In the disclosed embodiment, ISSG oxide is better suited than chemical oxide as it is thicker and denser and has a higher quality so that it can remain in place through multiple masking and implant steps. The use of ISSG oxide minimizes the thermal budget for the fabrication process when compared to other types of oxides such as furnace oxide.

Although the present disclosure has been described in detail with reference to a particular embodiment, it should be understood that various other changes, substitutions, and alterations may be made hereto without departing from the spirit and scope of the appended claims. Although the present disclosure includes a description with reference to a specific ordering of processes, other process sequencing may be followed and other incidental process steps may be performed to achieve the end result discussed herein. Moreover, process steps shown in one set of figures may also be incorporated into another set of figures as desired.

Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

What is claimed is:

1. A method for fabricating a structure comprising a portion of a plurality of semiconductor devices, the method comprising:
providing a substrate having thereon a substantially flat surface comprising crystalline silicon having thereon at least one set of doped wells;
providing a first protective layer on the substrate through which ion implantation steps are to be performed, the first protective layer comprising chemical oxide;
isolating a first exposed area of a substrate using a first mask with the first protective layer directly over the first exposed area;
implanting common dopants amenable for forming first device type elements through the first protective layer in the first exposed area;
removing the first mask and the first protective layer from the substrate, removal of the first mask and the first protective layer causing a loss of silicon in the substrate;
forming a second protective layer directly on the substrate through which ion implantation steps are to be performed;
isolating a second exposed area using a second mask;
implanting common dopants amenable for forming second device type elements through the second protective layer in the second exposed area;
removing the second mask while minimizing removal of the second protective layer;
removing the second protective layer.

2. The method of claim 1, wherein the second protective layer is an oxide layer formed by in situ steam generation.

3. The method of claim 1, wherein the second protective layer has a thickness of approximately two to five nanometers.

4. The method of claim 1, wherein the second protective layer comprises an insulative material having a thickness of at least 2.5 nanometers.

5. The method of claim 1, further comprising:
subsequently forming comparable first device type elements in a second lot, wherein the first and second device type elements are part of a first lot, the loss of silicon in the substrate being consistent between the first and second lots.

6. The method of claim 1, further comprising:
performing a low temperature anneal after the removal of the second mask and the second protective layer, the low temperature anneal operable to recrystallize the substrate after becoming amorphous by the implantation of the common dopants for first device type elements in the second exposed area.

7. The method of claim 6, further comprising:
performing a high temperature anneal after the low temperature anneal to activate the dopants for the first device type elements.

8. The method of claim 1,
wherein removal of the second protective layer includes an optional removal of a fixed amount of a surface of the substrate damaged as a result of the implants.

9. The method of claim 8, further comprising:
forming an undoped epitaxial channel layer on the substrate.

10. The method of claim 1, further comprising:
isolating a third exposed area comprising a subportion of the first exposed area using a third mask;
implanting specific dopants for forming additional first device type elements through the second protective layer in the third exposed area, the additional first device type elements having different properties;
removing the third mask while minimizing removal of the second protective layer.

11. The method of claim 10, further comprising:
isolating a fourth exposed area comprising a subportion of the second exposed area using a fourth mask;
implanting specific dopants amenable for forming additional second device type elements through the second protective layer in the fourth exposed area, the additional second device type elements having different properties;
removing the fourth mask while minimizing removal of the second protective layer.

12. The method of claim 11, further comprising:
subsequently forming comparable additional first and second device type elements in a second lot, wherein the additional first and second device type elements are part of a first lot, the loss of silicon in the substrate being consistent between the first and second lots.

13. The method of claim 11, further comprising:
performing a high temperature anneal after removal of the fourth mask to activate the dopants for the second device type elements.

14. A method for substrate preservation during transistor manufacture, comprising:
forming a first lot of various device type elements in a first substrate using a first process;
subsequently forming a second lot of various device type elements in a second substrate using the first process;
wherein a loss of silicon during the first process occurring in the second substrate of the second lot with respect to the device type elements therein is a same amount as a loss of silicon in the first substrate of the first lot with respect to the device type elements therein.

15. The method of claim 14, wherein the loss of silicon remains substantially the same amount between the first lot and the second lot despite a different number of photoresist mask reworking steps between the first lot and the second lot.

16. The method of claim 14, wherein photoresist mask reworking steps performed during formation of the first lot and the second lot do not effect silicon loss in the first substrate and the second substrate pertaining to a depth of the device type elements therein.

17. The method of claim 14, wherein no loss of silicon occurs during formation of the device type elements in the first and second lots.

18. The method of claim 17, wherein a single loss of silicon event occurs in the first and second lots, the single loss of silicon event effecting only common implants pertaining to the device type elements.

19. The method of claim 17, wherein a single loss of silicon event occurs with respect to common implants pertaining to the device type elements, the single loss of silicon event being a same amount between the first and second lots.

* * * * *